(12) United States Patent
Anderson et al.

(10) Patent No.: US 8,293,634 B2
(45) Date of Patent: Oct. 23, 2012

(54) STRUCTURES AND METHODS FOR IMPROVING SOLDER BUMP CONNECTIONS IN SEMICONDUCTOR DEVICES

(75) Inventors: Felix P. Anderson, Colchester, VT (US); William Cote, Poughquag, NY (US); Daniel C. Edelstein, White Plains, NY (US); Thomas L. McDevitt, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 12/187,646

(22) Filed: Aug. 7, 2008

(65) Prior Publication Data

US 2010/0032829 A1    Feb. 11, 2010

(51) Int. Cl.
*H01L 21/44* (2006.01)
(52) U.S. Cl. ........................... 438/612; 257/737
(58) Field of Classification Search .................. 438/612; 257/737
See application file for complete search history.

(56) References Cited

U.S. PATENT DOCUMENTS

| | | | |
|---|---|---|---|
| 6,066,577 A | 5/2000 | Cooney, III et al. | |
| 6,214,730 B1 | 4/2001 | Cooney, III et al. | |
| 6,310,300 B1 | 10/2001 | Cooney, III et al. | |
| 6,319,814 B1 | 11/2001 | Tsai et al. | |
| 6,452,251 B1 * | 9/2002 | Bernstein et al. | 257/532 |
| 6,518,646 B1 | 2/2003 | Hopper et al. | |
| 6,566,260 B2 | 5/2003 | Chooi et al. | |
| 6,723,639 B1 | 4/2004 | Liu et al. | |
| 6,905,981 B1 | 6/2005 | Todd et al. | |
| 6,977,435 B2 * | 12/2005 | Kim et al. | 257/734 |
| 2002/0076917 A1 | 6/2002 | Barth et al. | |
| 2004/0182915 A1 | 9/2004 | Bachman et al. | |
| 2005/0124149 A1 * | 6/2005 | Kim et al. | 438/618 |
| 2005/0142862 A1 | 6/2005 | Chun | |
| 2005/0263892 A1 | 12/2005 | Chun | |
| 2006/0240187 A1 * | 10/2006 | Weidman | 427/248.1 |
| 2006/0292860 A1 * | 12/2006 | Liu et al. | 438/624 |
| 2008/0191296 A1 * | 8/2008 | Wang et al. | 257/432 |
| 2009/0212439 A1 * | 8/2009 | Farooq et al. | 257/773 |

OTHER PUBLICATIONS

"Directive 2002/95/EC of the European Parliament . . . and electronic equipment", Feb. 13, 2003, URL: http://eur-lex.europa.eu/LexUriServ/Le xUriServ.do?uri=OJ:L:2003:037:0019:023:EN:PDF.
Communication Relating to the Results of the Partial International Search for PCT/EP2009/060213.
International Search Report and Written Opinion for corresponding International Appl. No. PCT/EP2009/060213, dated Sep. 10, 2010.

\* cited by examiner

*Primary Examiner* — Shaun Campbell
(74) *Attorney, Agent, or Firm* — Richard Kotulak; Roberts Mlotkowski Safran & Cole, P.C.

(57) ABSTRACT

Structures with improved solder bump connections and methods of fabricating such structures are provided herein. The structure includes a trench formed in a dielectric layer which has at least a portion thereof devoid of a fluorine boundary layer. The structure further includes a copper wire in the trench having at least a bottom portion thereof in contact with the non-fluoride boundary layer of the trench. A lead free solder bump is in electrical contact with the copper wire.

14 Claims, 13 Drawing Sheets

STRUCTURES AND METHODS FOR IMPROVING SOLDER BUMP CONNECTIONS IN SEMICONDUCTOR DEVICES

The invention relates to integrated circuits, and more particularly, to structures with improved solder bump connections and methods of fabricating such structures.

BACKGROUND

Traditionally, high temperature C4 (Controlled Collapse Chip Connection) bumps have been used to bond a chip to a substrate with the most common and widely utilized package being an organic laminate. Conventionally, the C4 bumps (solder bumps) are made from leaded solder, as it has superior properties. For example, lead is known to mitigate thermal coefficient (TCE) mismatch between the chip and the substrate (i.e., organic laminate). Accordingly, stresses imposed during the cooling cycle are mitigated by the C4 bumps, thus preventing delaminations or other damage from occurring to the chip or the substrate.

Lead-free requirements are now being imposed by many countries forcing manufacturers to implement new ways to produce chip to substrate joints. For example, solder interconnects consisting of tin/copper, tin/silver (with high concentrations of silver) and tin/gold in combination with SAC alloys are being used as a replacement for the leaded solder interconnects. With lead-free requirements, though, concerns about defects in C4 interconnections have surfaced, e.g., cracks in chip metallurgy under C4 bumps (named "white bumps" due to their appearance in C-Mode Scanning Acoustic Microscopy (CSAM) inspection processes) which lead to failure of the device. More specifically, white bumps are C4's that do not make good electrical contact to the Cu last metal pad, resulting in either failing chips at functional test or in the field. This may be attributable, at least in part, due to chip designs using high stress Pb-free C4 (solder bumps) which exacerbate C4/AlCu bump to Cu wire adhesion problems. Adhesion problems may also arise due to water absorption or fluorine instability in the fluorine-doped $SiO_2$ (FSG) intermetal dielectric surface, either in damascene trenches (e.g. TaN liner/FSG interface) or on the planer FSG surface (FSG/SiN or FSG/SiCN interface).

As one illustrative example, during the chip joining reflow, the chip and its substrate are heated to an elevated temperature (about 250° C.) in order to form the solder interconnection joints. The initial portion of the cool down leads to little stress build up; however, as the joints solidify (around 180° C. for small lead-free joints), increased stress is observed on the package. In particular, as the package (laminate, solder and chip) begins to cool, the solder begins to solidify (e.g., at about 375° C.) and the laminate begins to shrink as the chip remains substantially the same size. The difference in thermal expansion between the chip and the substrate is accommodated by out-of-plane deformation (warpage) of the device and the substrate, and by the shear deformation of the solder joints. The peak stresses on the device occur during the cool down portion of the reflow.

As the solder is robust and exceeds the strength of the chip, tensile stresses begin to delaminate structures on the chip. The high shear stresses caused by the TCE mismatch between the chip (3.5 ppm) and the laminate (16 ppm) results in an interfacial failure (i.e., a separation between the BEOL copper and the dielectric (FSG) under the C4). This interfacial failure embodies itself as cracks in the chip metallurgy under C4 bumps.

Accordingly, there exists a need in the art to overcome the deficiencies and limitations described hereinabove.

BRIEF SUMMARY

In a first embodiment of the invention, a method of manufacturing a semiconductor structure comprises forming a trench in at least one dielectric layer wherein at least a portion of the trench is devoid of a fluorine boundary layer. The method further comprises depositing a copper wire, which is composed of a refractory metal liner and a copper bulk conductor, in the trench such that at least a bottom portion of the refractory metal liner of the copper wire is in contact with the non-fluoride boundary layer of the trench. The method further comprises forming a lead free solder bump in electrical contact with the copper wire.

In embodiments, the at least one dielectric layer is undoped silicate glass (USG) and fluorosilicate glass (FSG). The USG is deposited between an upper layer and lower layer of the FSG and the trench extends within the upper layer of the FSG and into the USG. The trench is formed within the FSG and extends into the USG such that the bottom portion of the copper wire is in contact with the USG layer. The at least one dielectric layer is USG and the trench is formed completely in the USG such that the copper wire is embedded completely within the USG. The at least one dielectric layer is FSG and the method further comprises denuding the trench of fluorine such that the copper wire is in contact with the non-fluoride layer of the trench. The denuding comprises exposing the trench to a non-oxidizing, e.g. one of Ar, $N_2$, $H_2$, $NH_3$, $SiH_4/NH_3$, and $SiH_4/NH_3/N_2$, plasma, prior to the deposition of the copper and formation of the lead free solder bump. The denuding comprises exposing the trench to a plasma prior to the deposition of the copper wire. The at least one dielectric layer is FSG and the method further comprises depositing an $SiO_2$ layer in the trench prior to the deposition of the copper wire.

In a second embodiment of the invention, a method of manufacturing a structure having at least one lead free solder bump, comprises: forming a trench in a first dielectric layer having at least a lower portion thereof free of fluorine; depositing a copper wire in the trench such that at least a bottom portion of the copper wire is in contact with the lower portion which is free of fluorine; and forming a lead free solder bump in electrical contact with the copper wire.

In a third embodiment of the invention, a lead free solder bump structure comprises a trench formed in a dielectric layer which has at least a portion thereof devoid of a fluorine boundary layer. The structure further comprises a copper wire in the trench having at least a bottom portion thereof in contact with the non-fluoride boundary layer of the trench. A lead free solder bump is in electrical contact with the copper wire.

In embodiments, the dielectric layer is fluorosilicate glass (FSG) and the trench is denuded of fluorine. The dielectric layer is FSG and the trench is lined with $SiO_2$. The dielectric layer is undoped silicate glass (USG) sandwiched between an upper and lower layer of FSG. The dielectric layer is USG and the copper wire is embedded completely within the USG.

In a fourth embodiment of the invention, a lead free solder bump structure, comprises: a lower dielectric layer; a trench formed in the lower dielectric layer, the trench having at least a bottom portion thereof being devoid of fluorine; a copper wire in the trench having at least a bottom portion thereof in contact with the bottom portion of the trench; and a lead free solder bump in electrical contact with the copper wire and an intermediate metal.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

Figure 1:
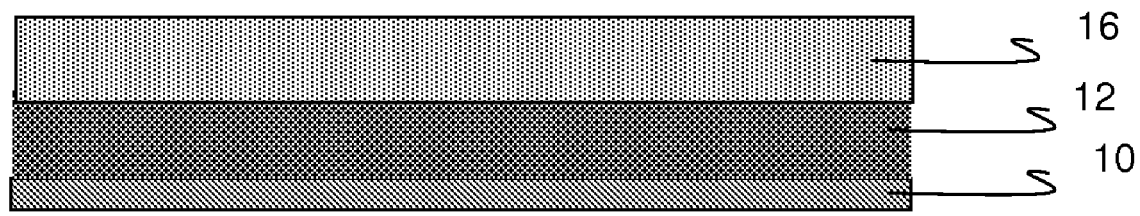
FIGS. 1-9 show intermediate structures and respective processing steps in accordance with a first embodiment of the invention.

The invention relates to integrated circuits and, more particularly, to structures with improved C4 solder bump connections and methods of fabricating such structures. More specifically, the present invention provides structures and methods of manufacturing structures which optimizes the fluorinated silicon dioxide (FSG) copper integration process and layout specifically accounting for higher stresses associated with lead free solder connections in, for example, 200 mm, 300 mm, 450 mm, and larger wafers. Although the present invention is directed to a 300 mm wafer Cu-FSG integration issue, the advantages of the present invention are extendable to any chip designs using FSG and a Cu wire intermetal dielectric and any wafer size. Accordingly, the processes of the present invention will provide benefits for future copper wiring generations.

In embodiments, the present invention contemplates many different structural changes in conventional solder bump connections in order to provide more robust and stronger solder bump connections thereby preventing delaminating issues. For example, in embodiments, the present invention eliminates the SiN/FSG interface at the top of the last Cu wire level by replacing the FSG dielectric used for the last Cu wire level with a FSG/USG dielectric. In embodiments, the USG dielectric is present on the wafer post-processing to a thickness of greater than 0, preferably at least about 50 nm (6 sigma). This means that the nominal USG thickness will need to be greater than 50 nm (e.g. 100 nm) so that the natural variability in dielectric deposition thickness, RIE removal, CMP removal, etc. leave at least 50 nm of USG. Although 50 nm of USG is specified herein, this is a function of the fluorine stability and process integration issues, such as wire RIE trench profile, and could be reduced to near 0 (e.g., under 10 nm) with proper FSG and/or process integration. In further embodiments, the present invention eliminates a TaN/FSG interface by replacing the FSG dielectric used at the last Cu wire level with a FSG/USG/FSG sandwich. In such an embodiment, the Cu wire bottom resides completely in the USG dielectric with, for example, about 50 nm of bordering (6 sigma). Although it is noted that the copper wire refractory metal is TaN, any copper wire trench liner or combination of liners, including but not limited to one or more of Ta, TaN, Ru, RuN, CoWP, W, WN, etc. could be used with the present invention.

In still further embodiments, a trench formed in FSG can be denuded of fluorine by exposing the wafer to $NH_3$ or $SiH_4/NH_3$, or $SiH_4/NH_3/N_2$, etc. plasma, prior to the deposition of the refractory metal liner of the copper wire. Alternatively, the trench may be denuded of fluorine by exposing the wafer to a hydrogen or ammonia, etc. plasma at elevated temperature (e.g., about 200° C.-400° C.), prior to the deposition of the refractory metal liner of the copper wire. In yet another alternative, the trench can be lined with $SiO_2$ prior to the deposition of the refractory metal liner of the copper wire. In this embodiment, the trench can be intentionally patterned larger than a final target depth and/or width (e.g., about 40 nm wider than the final target if a 30 nm $SiO_2$ film is deposited with 67% sidewall step coverage). After formation of the trench, a layer of $SiO_2$ (e.g., approximately 30 nm) can be deposited in the trench to provide a buffer layer between a TaN liner of the copper wire and FSG dielectric. Note that, although a TaN refractory metal liner of the damascene copper wire is contemplated herein, the present invention also envisions the use of any liner film(s), such as TaN/Ta, TaN/Ru, Ru, TiN, etc., as known in the art.

Advantageously, in any of the embodiments, the damascene copper wire TaN liner to FSG interface at the wire bottom is eliminated thus improving adhesion of the copper to the structure. This, in turn, improves the copper integration process and layout specifically addressing higher stresses associated with lead free solders, amongst other causes of white bump.

Figure 8:
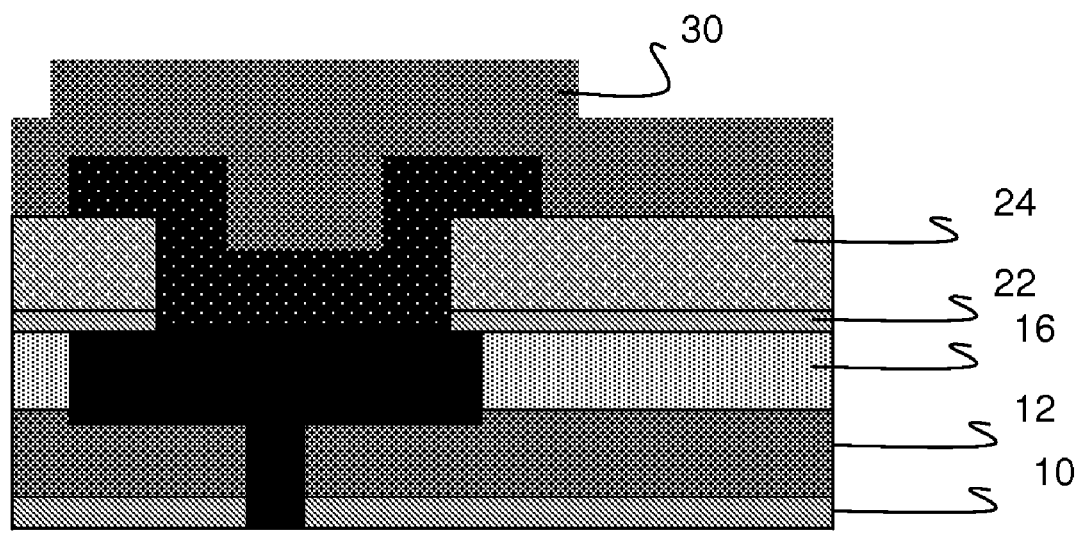
Figure 9:
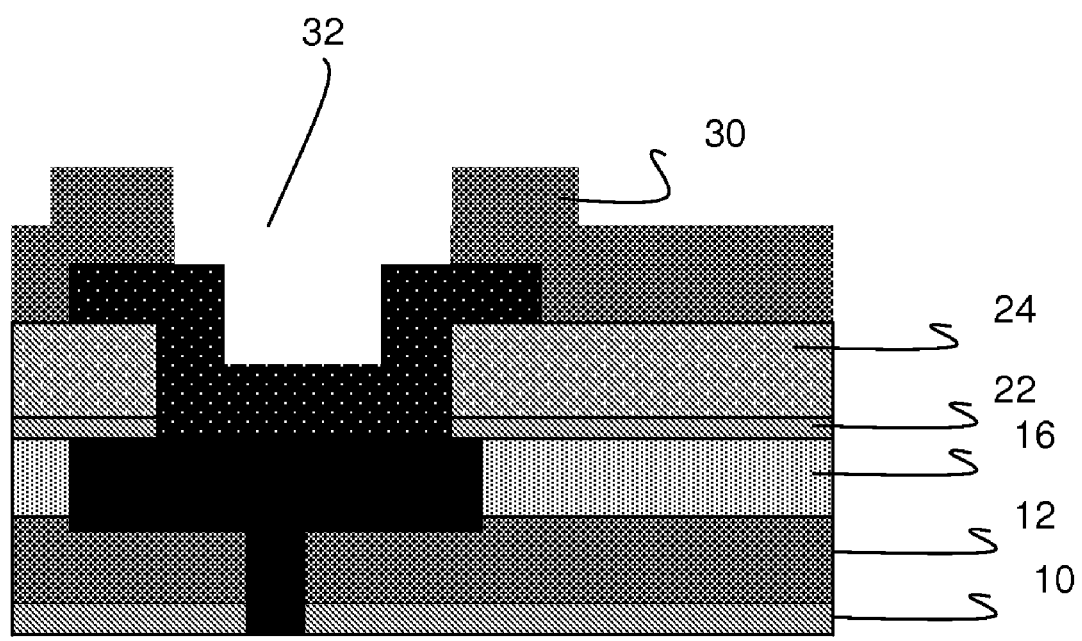
Figure 10:
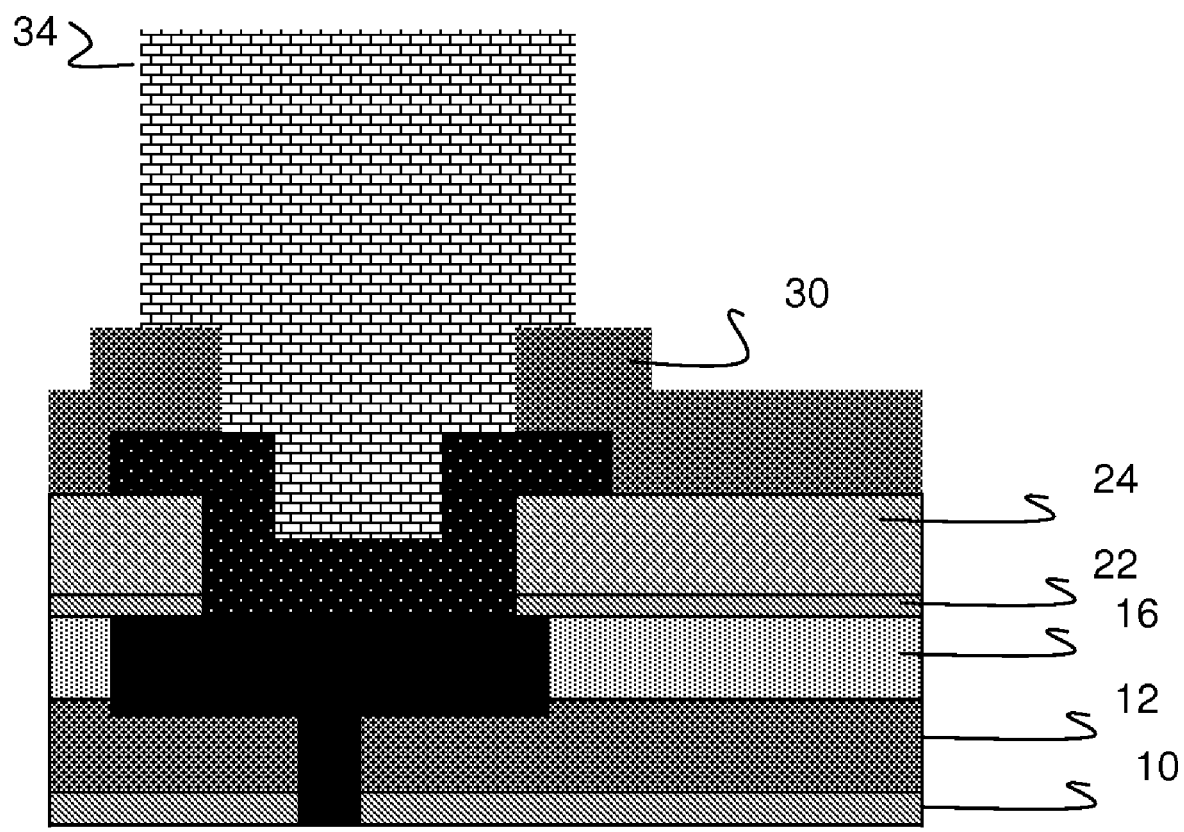
FIG. 10 shows a final structure and respective processing steps in accordance with the first embodiment of the invention.

FIGS. 1-9 show intermediate structures and respective processing steps in accordance with a first embodiment of the invention. FIG. 10 shows a final structure and respective processing steps in accordance with the first embodiment of the invention. In particular, FIG. 1 shows a beginning structure comprising a layer of dielectric 12 deposited on a SiN layer 10. If the dielectric layer is over a copper wiring level, then layer 10 could include any known copper diffusion barrier, such as SiCN, as known in the art; or could be omitted if a dielectric diffusion barrier is not needed (e.g., the underlying copper wires are capped with a metal, such as CoWP as known in the art). The dielectric layer 12 is preferably, for example, undoped silicate glass (USG). Next, a fluorosilicate glass (FSG) layer 16 is deposited. Dielectric layers 10, 12, and 16 could be deposited in separate tools or in a clustered tool; and layers 12 and 16 could be deposited either in the same chamber sequentially with no vacuum break between the films, as known in the art. These dielectric layers could be deposited using any known method, such as plasma-enhanced chemical vapor deposition (PECVD). The SiN, USG, and FSG thickness will be related to the wire and via height.

In one embodiment, which assumes that 100 nm of FSG will be removed from the top surface during the etching and chemical mechanical polishing integration and the wire height is 500 nm and via height is 500 nm, the SiN, USG, and FSG layers could have 50 nm, 550 nm, and 500 nm thickness, respectively. In embodiments, the formation of the dual-damascene wire and via trenches and subsequent cleans and metallization are known in the art and therefore will not be described in detail. Although a dual-damascene via first process integration is shown to form the copper wires, the invention contemplates the use of any integration scheme including trench first, via second; single damascene copper; damascene tungsten stud via with damascene copper wire; etc.

Figure 2:
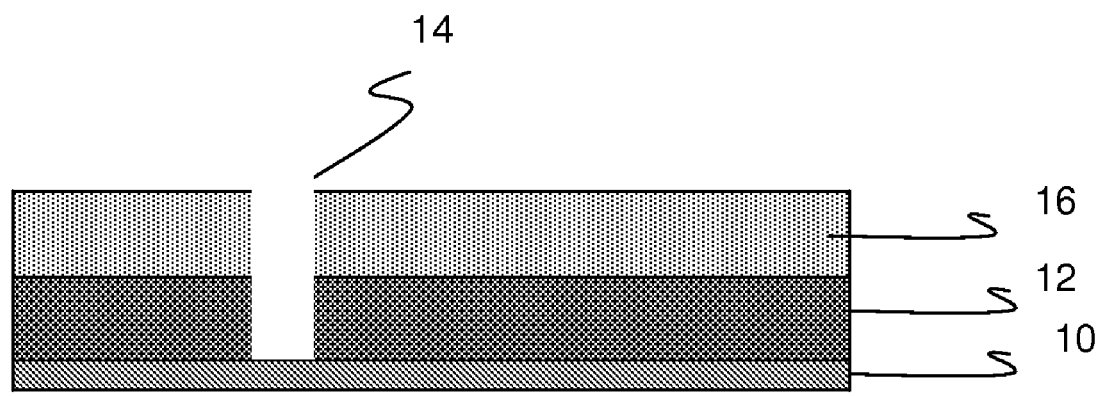
Figure 3:
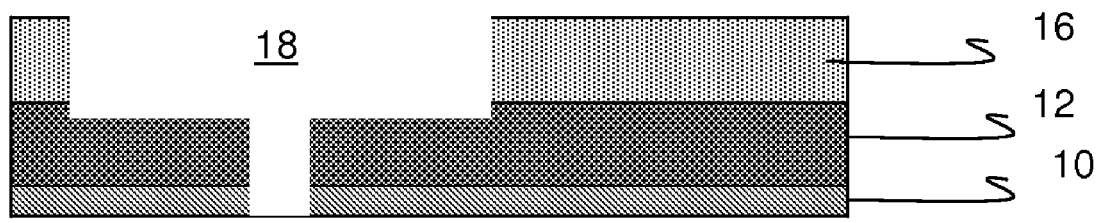

In FIG. 2, a via 14 is lithographically patterned and etched as known in the art. In FIG. 3, a wire trench 18 is lithographically patterned and etched as known in the art in the FSG layer 16 and extends slightly into the USG layer 12. In embodiments, due to process variability, the trench 18 will extend into the USG layer 12 ensuring that a bottom portion of copper wire remains embedded in or contact with the USG layer 12. The trench 18 can be formed using conventional lithography and etching processes such as, for example, reactive ion etching (RIE). During the wire trench 18 integration, the SiN layer 10 under the via 14 is removed to expose an underlying wire or other element (not shown). The present invention also contemplates the wire trenches both with (as shown) and without vias under them, as known in the art.

Figure 4:
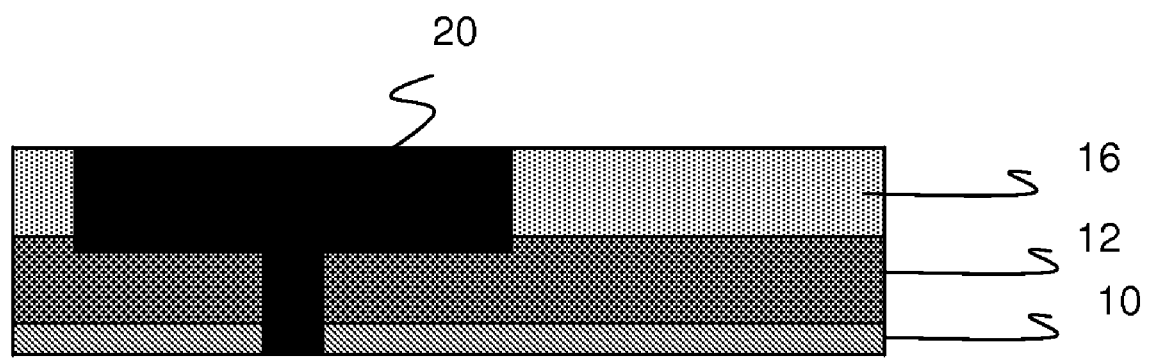

In FIG. 4, a copper wire 20 is formed in the trench 18 using any known method, such as depositing a TaN liner and Cu seed layer using physical vapor deposition (PVD), electroplating (ECD) copper, and chemical-mechanical polishing (CMP) the copper. As representatively shown in FIG. 4, regardless of the processing variability, a bottom portion of the copper wire 20 is embedded in or contact with the USG layer 12. Thus, an interface between the USG layer 12 (non-fluorine layer) and the copper wire 12 is ensured, thereby increasing the adhesion properties of the copper wire and hence the overall robustness and strength of the structure.

Figure 5:
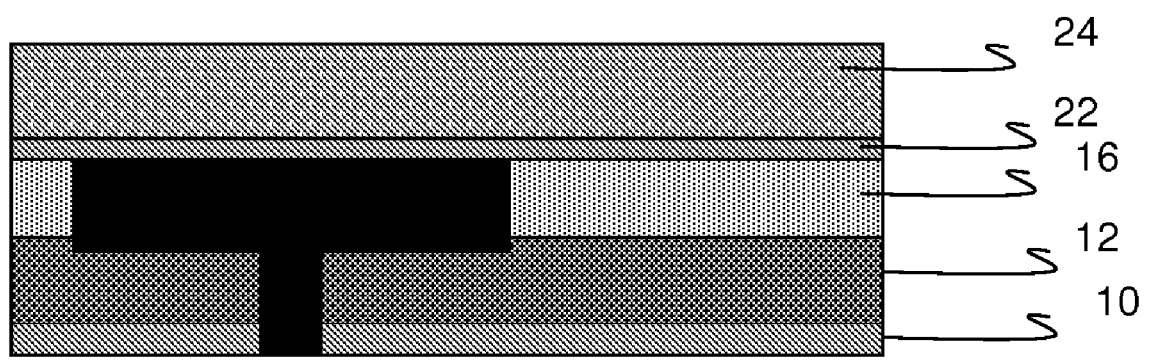
Figure 6:
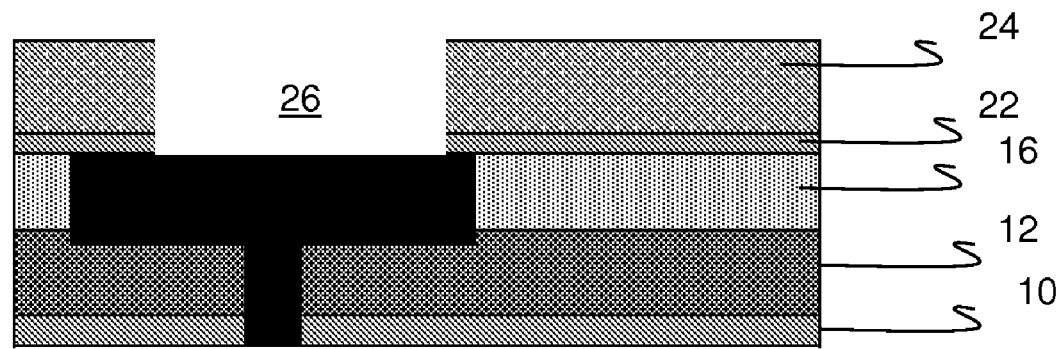

FIGS. 5-10 show conventional processing steps for forming a Pb-free solder bump on the structure of FIG. 4, with FIG. 10 being the final structure. Although this invention focuses on the use of Pb-free solder bumps, it is applicable to any packaging scheme which puts high stress on the chip containing the damascene copper wires. In particular, as shown in FIG. 5, an SiN layer 22 is deposited on the structure of FIG. 4. An $SiO_2$ layer 24 is deposited on the SiN layer 22. As shown in FIG. 6, a via trench 26 is formed in the SiN layer 22 and the $SiO_2$ layer 24, to the copper wire 20. The trench 26 is formed using conventional photolithography and etching processes such that further explanation is not required herein for a person of ordinary skill in the art to practice the invention. The dielectric layers 22 and 24 are deposited by any known method, such as PECVD, and could use any known permutation of passivation films as known in the art.

Figure 7:
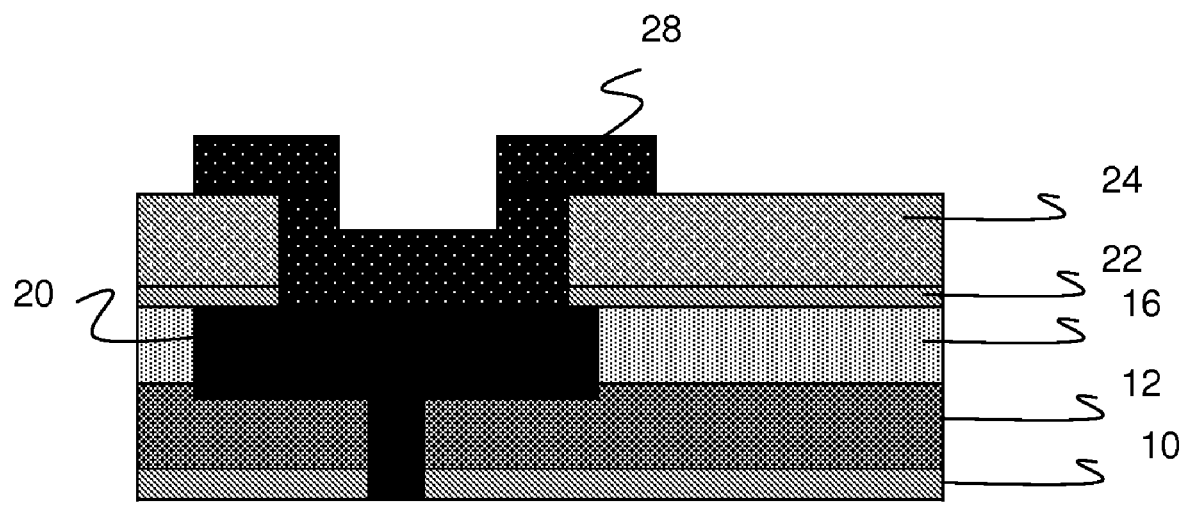

As shown in FIG. 7, a wire 28 such as, for example, TaN/TiN/AlCu/TiN where the AlCu thickness is much greater than the TaN and TiN thickness, is deposited, lithographically patterned, and etched in and around the trench 26 using methods known in the art. The wire 28 makes electrical contact with the wire 20. During the deposition process, a portion of the wire 28 can be deposited on the surface of the $SiO_2$ layer 24.

In FIG. 8, a dielectric layer 30 is formed over the structure of FIG. 7. The dielectric layer 30 may be, for example, $SiO_2$, SiN and a polyimide layer. As shown in FIG. 9, a trench 32 is formed in the dielectric layer 30 and wire 28 using conventional processes. As shown in FIG. 10, a Pb-free solder bump 34 is formed in the trench 32 using methods known in the art. Although AlCu wires 28 are only shown under solder bumps, the invention also contemplates the use of AlCu wires 28 without vias under them or solder bumps over them, as known in the art. Although FIG. 10 shows the solder bump 34 inside the AlCu wire 28, the solder bump 34 could also extent outside the AlCu wire 28, as known in the art.

Figure 11:
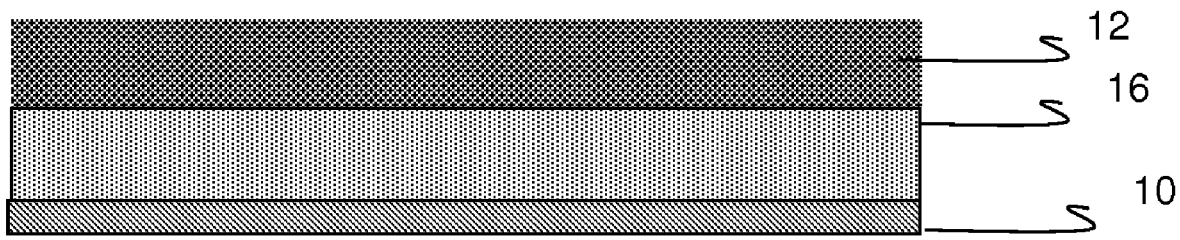
FIGS. 11-13 show intermediate structures and respective processing steps in accordance with a second embodiment of the invention.
Figure 12:
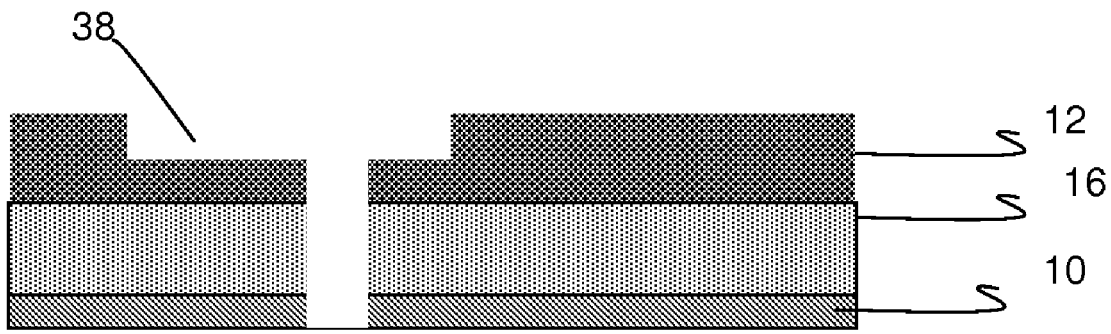
Figure 13:
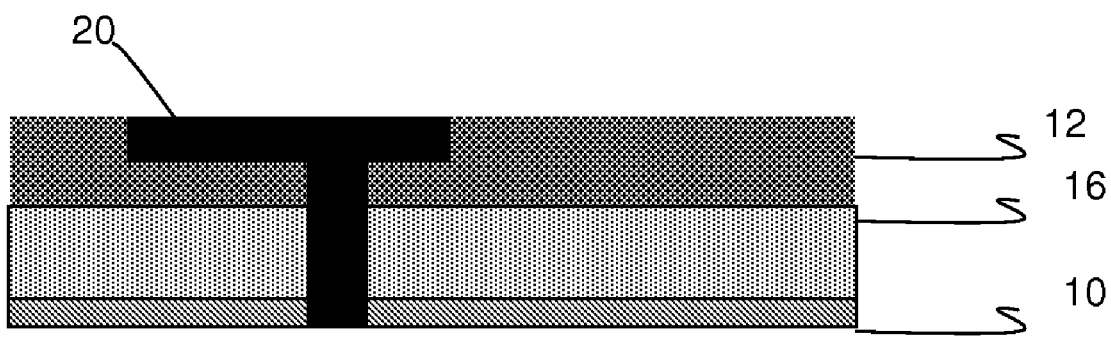
Figure 14:
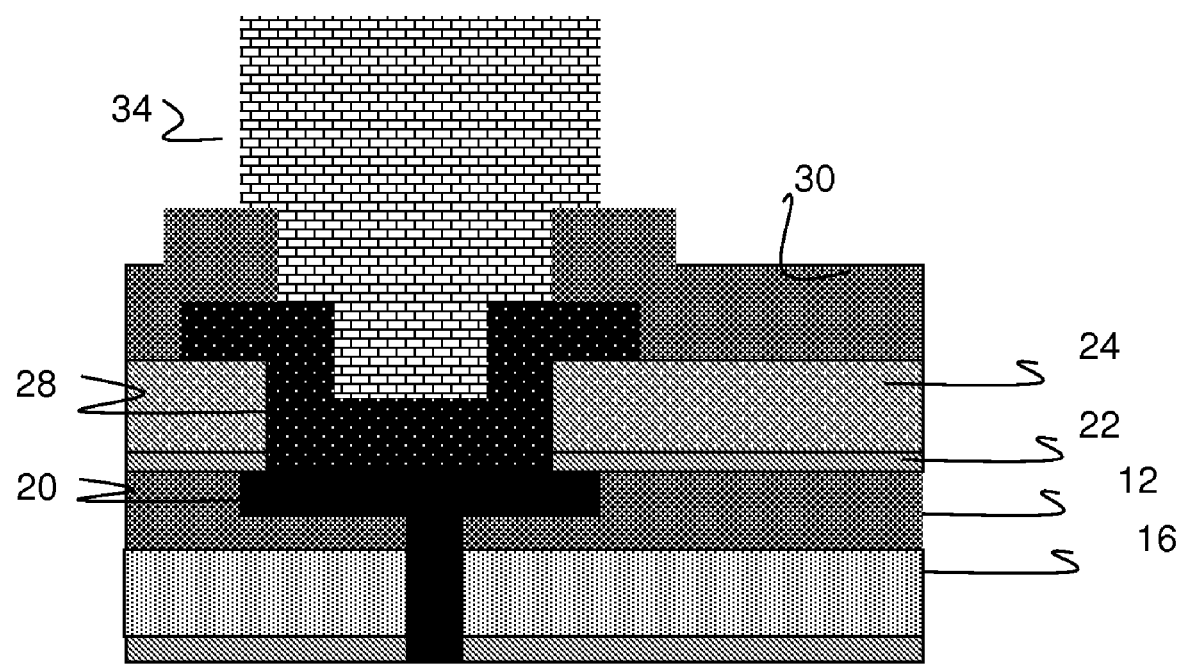
FIG. 14 shows a final structure and respective processing steps in accordance with the second embodiment of the invention.

FIGS. 11-13 show intermediate structures and respective processing steps in accordance with a second embodiment of the invention. FIG. 14 shows a final structure and respective processing steps in accordance with the second embodiment of the invention. In particular, FIG. 11 shows a beginning structure comprising a SiN dielectric layer 10 and layer of dielectric 12 deposited on an FSG dielectric 16. The dielectric layer 12 is preferably, for example, undoped silicate glass (USG).

In FIG. 12, a dual damascene wire and via trench 38 is formed in the structure of FIG. 11. More particularly, the wire trench 38 is formed completely in the USG layer 12. In embodiments, the trench 38 can be formed in any conventional lithography and etching processes, well known to those of skill in the art.

As shown in FIG. 13, copper wires and vias are formed in trench 38 to form a copper wire 20, using methods discussed previously. In embodiments, the copper wire 20 is embedded within the USG layer 12. This structure, e.g., copper wire 20 embedded within the USG layer 12, enhances the adhesion of the copper wire 20 to the structure of the present invention and, hence, increases the structures robustness and strength.

FIG. 14 shows conventional processing steps to form a Pb-free solder bump in accordance with the second embodiment of the invention. For example, an SiN layer 22 and an $SiO_2$ layer 24 is deposited on the structure of FIG. 13. A trench is formed in the SiN layer 22 and the $SiO_2$ layer 24, to the copper wire 20. A wire 28 such as, for example, AlCu, is deposited in the trench. The contract 28 makes electrical contact with the wire 20. During the deposition process, a portion of the wire 28 can be deposited on the surface of the $SiO_2$ layer 24. A dielectric layer 30 is formed over the wire 28 and the $SiO_2$ layer 24. A trench is formed in the dielectric layer 30 and wire 28. A Pb-free solder bump 34 is formed in the trench to complete the structure shown in FIG. 14.

Figure 15:
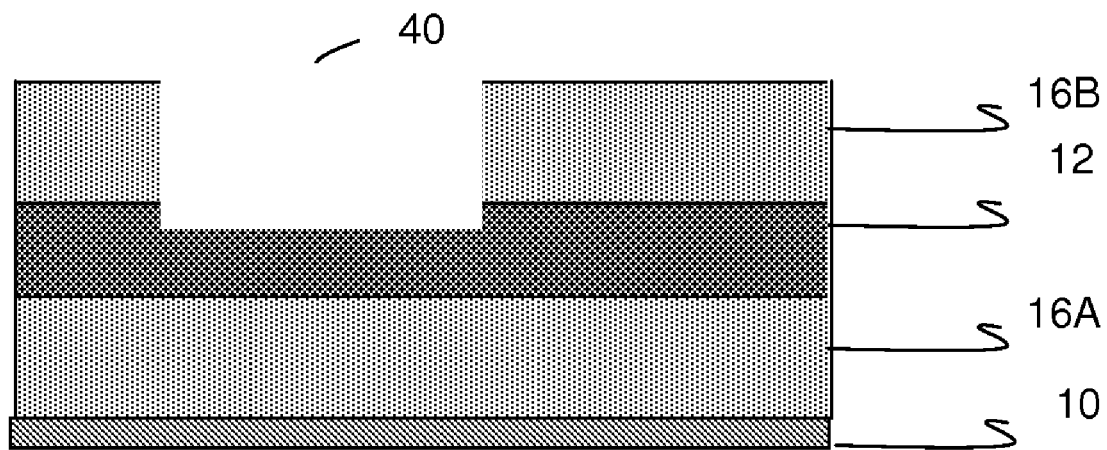
FIGS. 15-16 show intermediate structures and respective processing steps in accordance with a third embodiment of the invention.
Figure 16:
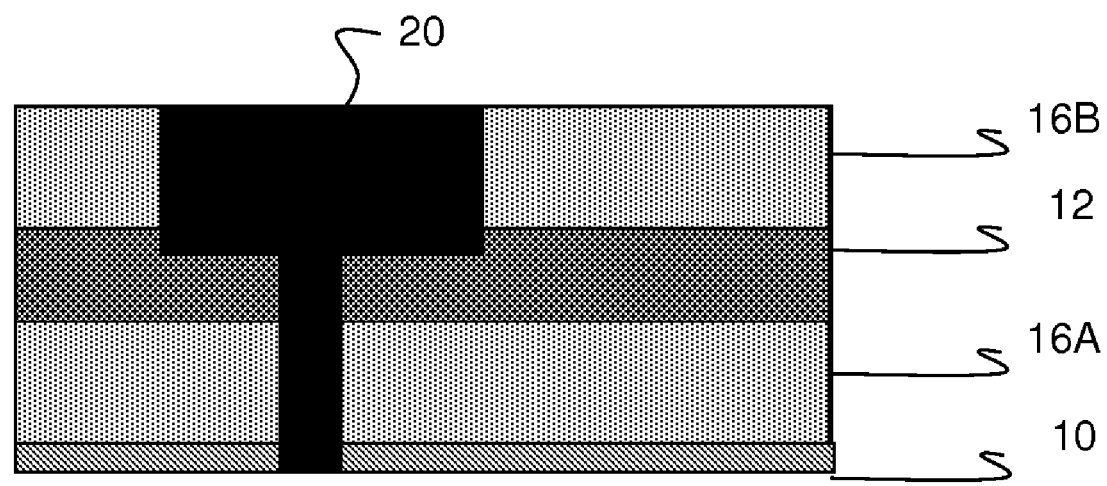
Figure 17:
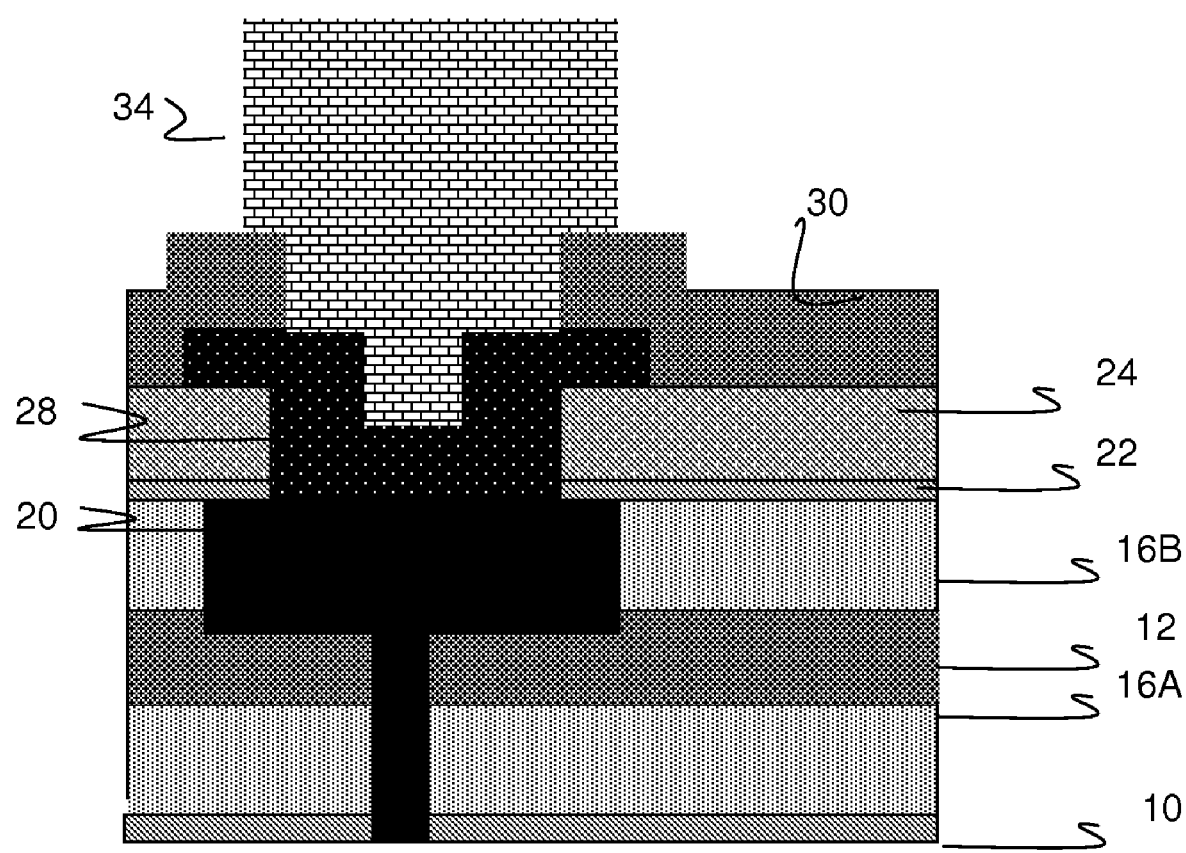
FIG. 17 shows a final structure and respective processing steps in accordance with the third embodiment of the invention.

FIGS. 15 and 16 show intermediate structures and respective processing steps in accordance with a third embodiment of the invention. FIG. 17 shows a final structure and respective processing steps in accordance with the third embodiment of the invention. In particular, FIG. 15 shows a beginning structure comprising a SiN dielectric layer 10 and a dielectric layer 12 such as, for example, undoped silicate glass (USG) layer 12 sandwiched between a lower layer of FSG dielectric 16A and an upper layer of FSG dielectric 16B. A trench 40 is formed in the upper layer of FSG 16B and extends to within a portion of the USG 12, similar to that described with reference to the first embodiment of the invention. The trench 40 can be formed using conventional lithography and etching processes.

In FIG. 16, a metal (copper) wire and via 20 are deposited in the trench 40. As representatively shown in FIG. 16, regardless of the processing variability, a bottom portion of the copper wire 20 is embedded in the USG layer 12. As previously discussed, the interface between the copper wire 20 and the USG layer 12 increases the adhesion properties of the copper wire to the overall structure.

FIG. 17 shows a final structure in accordance with the third embodiment of the invention. Similar to that described with reference to FIGS. 5-10, an SiN layer 22 and $SiO_2$ layer 24 are deposited on the FSG layer 16B. A trench is formed in the SiN layer 22 and the SiO$_2$ layer 24, to the copper wire 20. The trench is formed using conventional photolithography and etching process such that further explanation is not required herein for a person of ordinary skill in the art to practice the invention.

A wire 28 such as, for example, AlCu, is deposited in the trench. The contract 28 makes electrical contact with the wire 20. During the deposition process, a portion of the wire 28 can be deposited on the surface of the SiO$_2$ layer 24. A dielectric layer 30 is formed over the wire 28 and the SiO$_2$ layer 24. The dielectric layer 30 may be, for example, SiO$_2$, SiN or a polyimide layer. A trench is formed in the dielectric layer 30 and wire 28, and a Pb-free solder bump 34 is formed in the trench.

Figure 18:
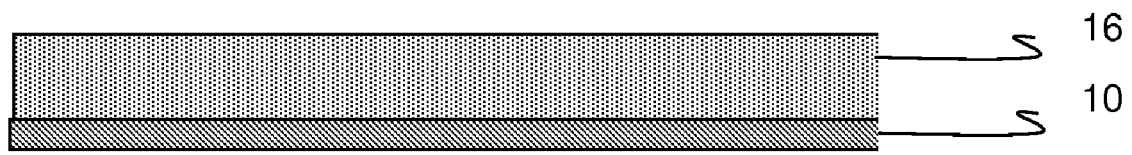
FIGS. 18-21 show intermediate structures and respective processing steps in accordance with a fourth embodiment of the invention.
Figure 19:
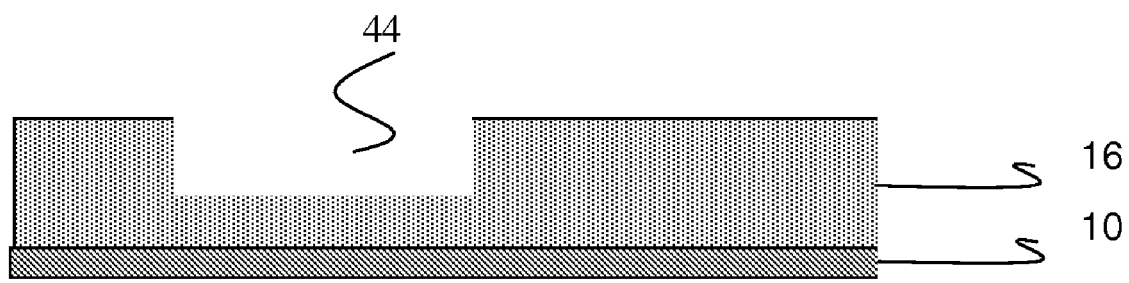

FIGS. 18-21 show intermediate structures and respective processing steps in accordance with a fourth embodiment of the invention. FIG. 22 shows a final structure and respective processing steps in accordance with the fourth embodiment of the invention. In particular, FIG. 18 shows a beginning structure comprising an FSG layer 16 deposited on an SiN layer 10. In embodiments, the SiN layer 10 can be substituted with a SiCN layer, for example, or omitted if the prior level wire does not have exposed copper. Alternatively, the FSG layer 16 could include an initial USG layer followed by a FSG layer. In FIG. 19, a trench 44 is formed in the FSG layer 16 using conventional lithography and etching processes. Although a wire trench is shown in FIG. 19, a dual-damascene via could also be present, either as shown previously with a via first integration method, or with a wire first, via second integration method.

Figure 20:
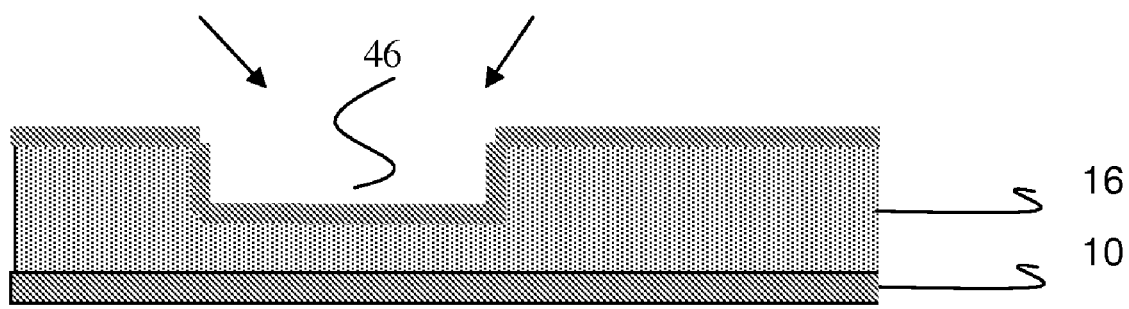

In FIG. 20, the trench 44 is denuded of fluorine by exposing the wafer to NH$_3$ or SiH$_4$/NH$_3$, or SiH$_4$/NH$_3$/N$_2$, O$_2$, etc. plasma, prior to the deposition of copper. Alternatively, the trench may be denuded of fluorine by exposing the wafer to a hydrogen or ammonia plasma at elevated temperature (e.g., about 200° C.-400° C.), prior to the deposition of the copper. These processes will form a layer 46, which is devoid of fluorine. The fluorine denuding step could be performed in a stand-alone reactor or as part of the TaN liner plasma preclean process. If underlying copper is exposed during the fluorine denuding step, then it should not contain oxygen since copper readily oxidizes when exposed to an oxygen-containing plasma.

Figure 21:
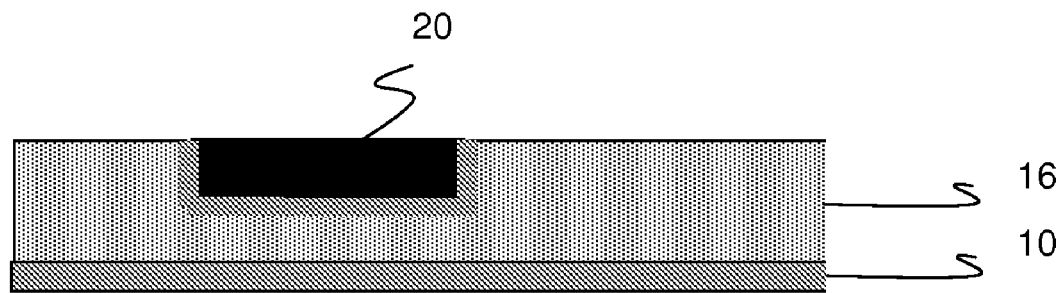
Figure 22:
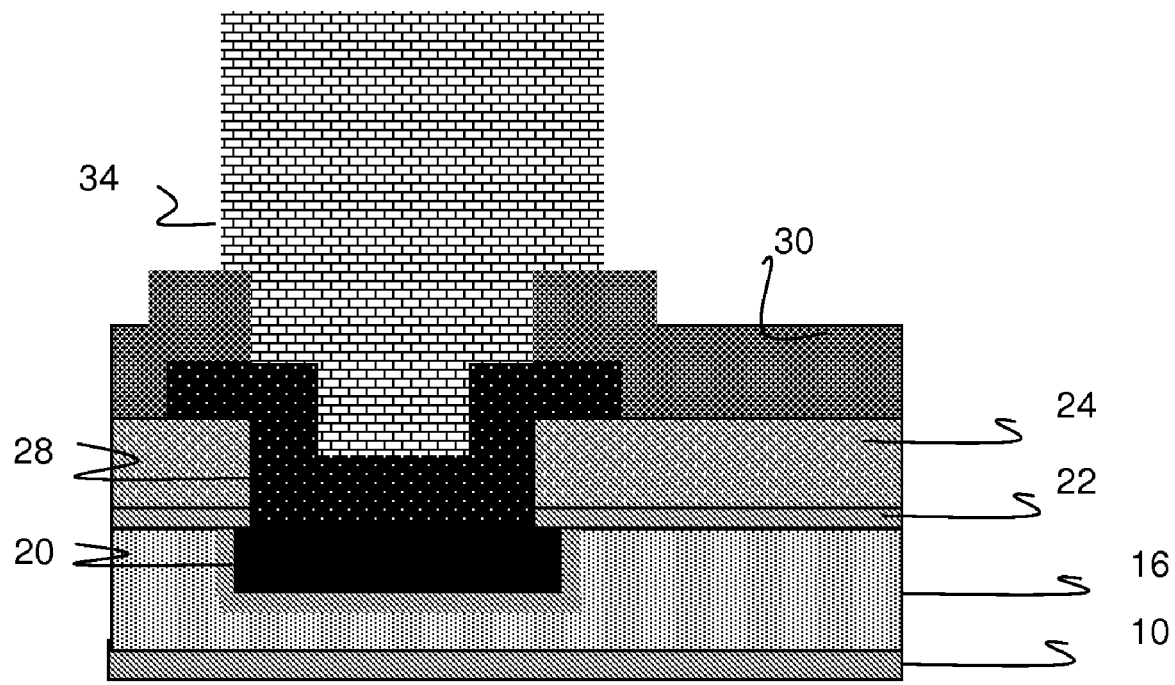
FIG. 22 shows a final structure and respective processing steps in accordance with the fourth embodiment of the invention.

In FIG. 21, the copper wire 20 is formed in the trench 44. As shown, the copper wire 20 is in contact with layer 46, which is devoid of fluorine. That is, the copper wire 20 is protected from the FSG layer 16 by the layer 46. The adhesion properties at the interface of the copper wire 20 and layer 46 are stronger than with fluorine thus increasing the overall strength and robustness of the structure.

FIG. 22 shows respective processing steps similar to that described with reference to the first embodiment of the invention. For example, an SiN layer 22 and SiO$_2$ layer 24 are deposited on the FSG layer 16. A trench is formed in the SiN layer 22 and the SiO$_2$ layer 24, to the copper wire 20. The trench is formed using conventional photolithography and etching process such that further explanation is not required herein for a person of ordinary skill in the art to practice the invention.

A wire 28 such as, for example, AlCu, is deposited in the trench. The contract 28 makes electrical contact with the wire 20. During the deposition process, a portion of the wire 28 can be deposited on the surface of the SiO$_2$ layer 24. A dielectric layer 30 is formed over the wire 28 and the SiO$_2$ layer 24. The dielectric layer 30 may be, for example, SiO$_2$, SiN or a polyimide layer. A trench is formed in the dielectric layer 30 and wire 28, and a Pb-free solder bump 34 is formed in the trench.

Figure 23:
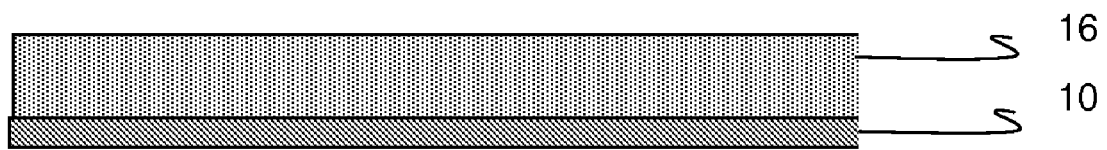
FIGS. 23-26 show intermediate structures and respective processing steps in accordance with a fifth embodiment of the invention.
Figure 24:
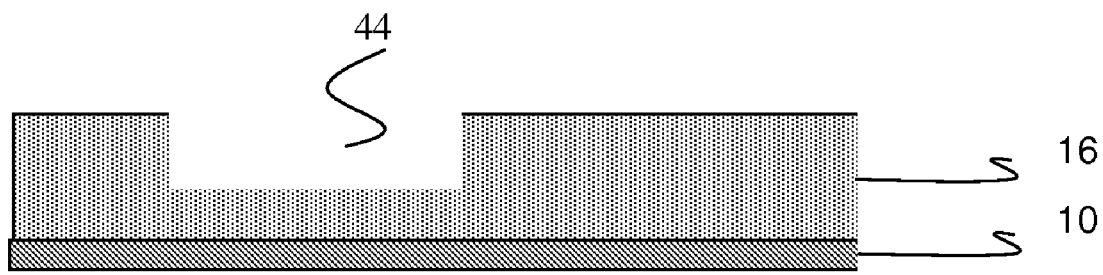

FIGS. 23-26 show intermediate structures and respective processing steps in accordance with a fifth embodiment of the invention. FIG. 27 shows a final structure and respective processing steps in accordance with the fifth embodiment of the invention. In particular, FIG. 23 shows a beginning structure comprising an FSG layer 16 deposited on an SiN layer 10. In embodiments, the SiN layer 10 can be substituted with a USG layer, for example. In FIG. 24, a trench 44 is formed in the FSG layer 16 using conventional lithography and etching processes. Although only a wire trench is shown in FIG. 19, a dual-damascene via could also be present, either as shown previously with a via first integration method, or with a wire first, via second integration method.

Figure 25:
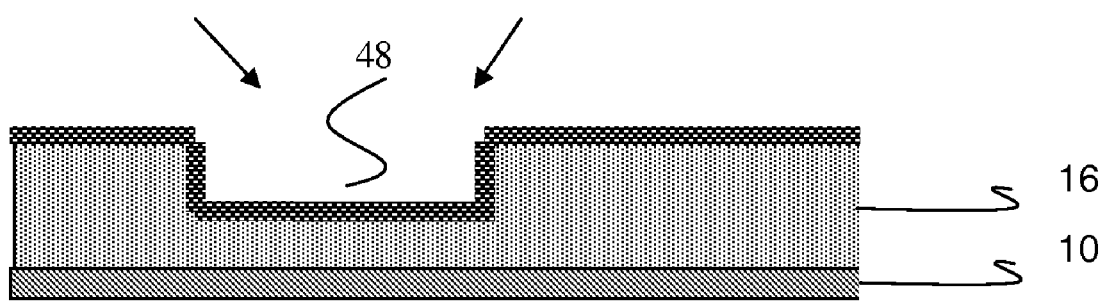

In FIG. 25, the trench 44 and surface are lined with a layer 48 of SiO$_2$ prior to the deposition of the copper. In this embodiment, the trench can be intentionally patterned larger than a final target depth and/or width (e.g., about 100 nm wider than the final target). After formation of the trench 44, the layer 48 of SiO$_2$ (e.g., approximately 50 nm) can be deposited in the trench 44 to provide a buffer layer between a TaN liner (or the copper) and FSG dielectric 16. This step should be performed before underlying copper is exposed; i.e., after the wire trough RIE step before via patterning in a wire first, via second dual damascene process, to prevent oxidization of the underlying copper surface.

Figure 26:
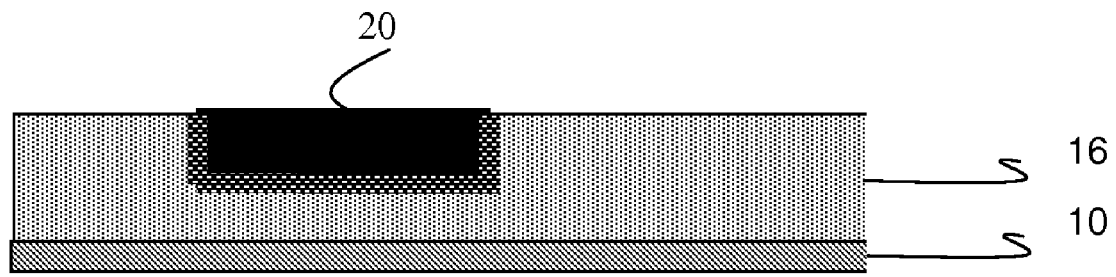
Figure 27:
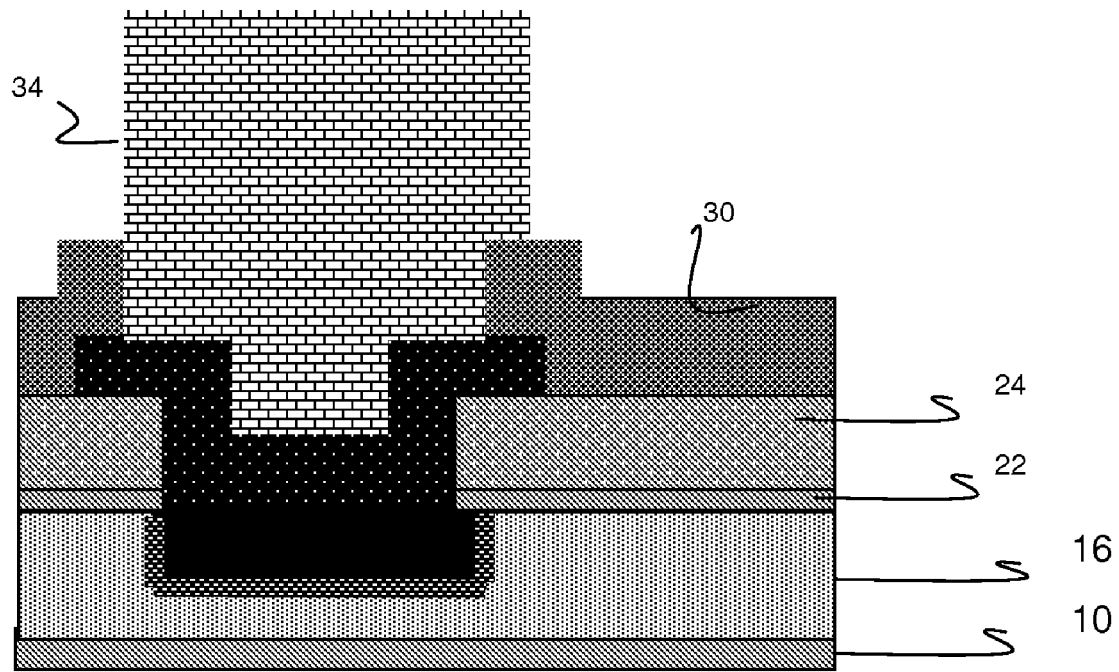
FIG. 27 shows a final structure and respective processing steps in accordance with the fifth embodiment of the invention.

In FIG. 26, the copper wire 20 is deposited in the trench 44. As shown, the copper wire 20 is in contact with the layer 48, which is devoid of fluorine. That is, the copper wire 20 is protected from the FSG layer 16 by the layer 48. The adhesion properties at the interface of the copper wire 20 and the layer 48 are stronger than with fluorine thus increasing the overall strength and robustness of the structure.

FIG. 27 shows respective processing steps similar to that described with reference to the first embodiment of the invention. For example, an SiN layer 22 and SiO$_2$ layer 24 are deposited on the FSG layer 16. A trench is formed in the SiN layer 22 and the SiO$_2$ layer 24, to the copper wire 20. The trench is formed using conventional photolithography and etching process such that further explanation is not required herein for a person of ordinary skill in the art to practice the invention.

A wire 28 such as, for example, AlCu, is deposited in the trench. The contract 28 makes electrical contact with the wire 20. During the deposition process, a portion of the wire 28 can be deposited on the surface of the SiO$_2$ layer 24. A dielectric layer 30 is formed over the wire 28 and the SiO$_2$ layer 24. The dielectric layer 30 may be, for example, SiO$_2$, SiN or a polyimide layer. A trench is formed in the dielectric layer 30 and wire 28, and a Pb-free solder bump 34 is formed in the trench.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a semiconductor structure, comprising:
    forming a pattern in at least two dielectric layers comprising fluorosilicate glass (FSG) and undoped silicate glass (USG), wherein the pattern extends only partially through the USG and at least a portion of the pattern is devoid of a fluorine boundary layer;
    depositing a copper wire in the pattern such that at least a bottom portion of the copper wire is in contact with the non-fluoride boundary layer of the pattern and at least another portion of the copper wire is in contact with the FSG; and
    forming a lead free solder bump in electrical contact with the copper wire.

2. The method of claim 1, wherein the USG is deposited between an upper layer and lower layer of the FSG and the pattern extends within the upper layer of the FSG and into the USG.

3. The method of claim 1, wherein the pattern is a trench which is formed within the FSG and extends into the USG such that the bottom portion of the copper wire is in contact with the USG layer.

4. A method of manufacturing a structure having at least one lead free solder bump, comprising:
    forming a dielectric layer comprising fluorosilicate glass (FSG) and undoped silicate glass (USG);
    forming a trench in the dielectric layer having at least a lower portion thereof free of fluorine such that the trench extends only partially through the USG;
    depositing a copper wire in the trench such that at least a bottom portion of the copper wire is in contact with the lower portion which is free of fluorine and at least another portion of the copper wire is in contact with the FSG; and
    forming a lead free solder bump in electrical contact with the copper wire.

5. The method of claim 4, wherein the USG is deposited between an upper layer and lower layer of the fluorosilicate glass (FSG) and the trench extends within the upper layer of the FSG and into the USG.

6. The method of claim 4, wherein the trench is formed within the FSG and extends into an underlying USG layer such that the bottom portion of the copper wire is in contact with the USG layer.

7. A method comprising:
    depositing a layer of undoped silicate glass (USG) layer over an SiN layer;
    depositing a fluorosilicate glass (FSG) layer on the USG layer;
    forming a dual-damascene wire by patterning and etching a via and a trench with a bottom portion of the trench extending into the USG layer such that the trench extends only partially through the USG layer, and depositing a metal within the via and the trench such that at least a bottom portion of the metal within the trench is embedded in the USG layer and at least another portion of the metal within the trench is in contact with the FSG layer;
    depositing an SiN layer over the USG layer and a surface of the dual-damascene wire;
    depositing an $SiO_2$ layer on the SiN layer;
    forming a via trench in the SiN layer and the $SiO_2$ layer to the dual-damascene wire;
    forming a wire of TaN/TiN/AlCu/TiN in the via trench, where the AlCu thickness is greater than the TaN and TiN thickness, wherein the wire makes electrical contact with the dual-damascene wire;
    forming a dielectric layer over the wire and the $SiO_2$ layer;
    forming a trench in the dielectric layer and the wire; and
    forming a Pb-free solder bump in the trench formed in the dielectric layer and the wire.

8. The method of claim 7, wherein the USG layer and the FSG layer are deposited in separate tools or in a clustered tool.

9. The method of claim 8, wherein the SiN layer has a thickness of 50 nm, the USG layer has a thickness of 550 nm and the FSG layer has a thickness of 500 nm.

10. The method of claim 9, wherein the metal is copper embedded in or contact with the USG layer thus forming an interface between the USG layer and the dual damascene wire.

11. The method of claim 7, wherein the trench for the dual damascene wire is formed in the FSG layer and extends to within a portion of the USG layer.

12. A method of manufacturing a semiconductor structure, comprising:
    forming a first SiN layer;
    forming an undoped silicate glass (USG) layer on the first SiN layer;
    forming a flurosilicate glass (FSG) layer on the USG layer;
    forming a via such that the via extends completely through the first SiN layer, the USG layer, and the FSG layer;
    forming a first trench in the FSG layer such that the first trench extends completely through the FSG layer and only partially through the USG layer; and
    forming a copper wire in the first trench such that a bottom portion of the copper wire is embedded in the USG layer and at least another portion of the copper wire in the first trench is in contact with the FSG layer, wherein an interface between the USG layer and the bottom portion of the copper wire is devoid of a fluorine boundary layer.

13. The method of claim 12, further comprising:
    forming a second SiN layer on the FSG layer and the copper wire;
    forming an $SiO_2$ layer on the second SiN layer;
    forming a second trench in the $SiO_2$ layer and the second SiN layer such that the second trench extends completely through the SiO$_2$ layer and the second SiN layer to a top surface of the copper wire; and forming a wire in the second trench such that the wire is in electrical contact with the copper wire and a portion of the wire is on a surface of the SiO$_2$ layer.

14. The method of claim 13, further comprising:

forming a dielectric layer in the second trench and on the wire;

forming a third trench in the dielectric layer such that the third trench exposes a surface of the wire; and forming a solder bump in the third trench and in contact with the surface of the wire.

\* \* \* \* \*